United States Patent [19]
Bottomley et al.

[11] Patent Number: 4,881,032
[45] Date of Patent: Nov. 14, 1989

[54] METHOD OF, AND APPARATUS FOR, NMR SPECTROSCOPIC METABOLITE IMAGING AND QUANTIFICATION

[75] Inventors: Paul A. Bottomley, Clifton Park; Peter B. Roemer; William A. Edelstein, both of Schenectady; Otward M. Mueller, Ballston Lake, all of N.Y.

[73] Assignee: General Electric Company, Schenectady, N.Y.

[21] Appl. No.: 260,633

[22] Filed: Oct. 21, 1988

[51] Int. Cl.$^4$ .............................................. G01R 33/20
[52] U.S. Cl. ..................................... 324/309; 324/318
[58] Field of Search ............... 324/300, 307, 309, 318, 324/306, 322

[56] References Cited

U.S. PATENT DOCUMENTS

| | | | |
|---|---|---|---|
| 4,319,910 | 3/1982 | Meyer | 71/27 |
| 4,506,223 | 3/1985 | Bottomley | 324/309 |
| 4,567,440 | 1/1986 | Haselgrove | 324/309 |
| 4,629,988 | 12/1986 | Bottomley | 324/309 |
| 4,683,431 | 7/1987 | Pattany | 324/306 |
| 4,689,560 | 8/1987 | Nayler | 324/306 |
| 4,699,148 | 10/1987 | Gyngell | 324/309 |
| 4,728,893 | 3/1988 | Feinberg | 324/309 |
| 4,737,716 | 4/1988 | Roemer | 324/319 |
| 4,740,753 | 4/1988 | Glover | 324/320 |

OTHER PUBLICATIONS

P. A. Bottomley et al., "Human in Vivo Phosphate Metabolite Imaging with $^{31}$P NMR*", Magnetic Resonance in Medicine 7, 319–336 (1988).

Primary Examiner—Michael J. Tokar
Attorney, Agent, or Firm—Geoffrey H. Krauss; James C. Davis, Jr.; Marvin Snyder

[57] ABSTRACT

A method for NMR spectroscopy metabolite imaging utilizes the steps of: applying to a desired portion of a sample a pulsed phase-encoding linear magnetic gradient signal in at least one of the three orthogonal dimensions of a Cartesian coordinate set, prior to acquisition of free-induction-decay NMR response signals from the sample portion; substantially eliminating from at least the sample portion eddy current fields induced responsive to the phase-encoding gradient pulses; maximizing the signal-to-noise ratio of the NMR response signals; and displaying the data resulting from Fourier transformation of the received response data. A high-field NMR imaging system is provided with self-shielded gradient coils, to subsantially remove eddy-current effects, and at least one of maximized-SNR antenna, of quadrature-driven volume RF coil and/or surface RF coil types are utilized for both transmission of the excitation RF pulses and reception of the RF response signals. The acquired FID data is filtered and a Fourier transform reconstruction, of dimension d' equal to one greater than the numder d of spatial dimensions to be displayed, is performed.

30 Claims, 8 Drawing Sheets

METHOD OF, AND APPARATUS FOR, NMR SPECTROSCOPIC METABOLITE IMAGING AND QUANTIFICATION

BACKGROUND OF THE INVENTION

The present invention relates to nuclear magnetic resonance (NMR) spectroscopy and, more particularly, to novel methods for 1-, 2-, and 3-dimensional metabolite imaging and quantification using NMR spectroscopy.

It is highly desirable to utilize spatially-localized in-vivo nuclear magnetic resonance (NMR) spectroscopy to acquire information about the distribution of certain low-abundance or low-sensitivity elements, such as $^{31}P$ and the like. By providing direct and non-invasive access to information about the concentration of relatively high-energy phosphate metabolites and other phosphorus compounds in living cells in normal and disease-comprised tissues, the state of the medical diagnostic arts can be advanced. Current techniques for localizing the desired NMR spectroscopy signals in human and intact animals has either invariably utilized small surface NMR detection systems, or been restricted to data acquisition from only a single selected volume element (voxel) at any one time. Thus, the acquisition of in-vivo spectroscopic images, where the term "image" is utilized to signify a display of the spatial variation of one or more physical properties, such as chemical shift spectra, which images are spatially resolved in 1, 2 or 3 dimensions (1D, 2D, 3D) has for many years proved impractical with NMR techniques monitoring free-induction-decay (FID) response signals and employing 2D, 3D and 4D Fourier transformation (FT), such as the techniques proposed by Brown et al. in U.S. Pat. No. 4,310,190 (1982). It will be understood that since each chemical shift spectrum itself has two dimensions (signal intensity and chemical shift, in parts per million or ppm.), the images involved in the present invention all have one more dimension d' than is usually displayed. While it is known to acquire spectroscopic images of certain elements, such as $^{31}P$, by the utilization of 2D, 3D and 4D FT techniques, employing NMR spin echoes, such as described in U.S. Pat. Nos. 4,506,223 and 4,567,440, these techniques are unsuitable for observing spatial distribution of important $^{31}P$ metabolites that have $T_2$ values so short as to decay substantially away during the spin-echo time interval. To date, these techniques have not allowed images to be obtained of short-$T_2$ metabolites, such as adenosine triphosphate (ATP), phosphodiesters (PD), and the like. Additionally, even those $^{31}P$ metabolites which have been observed, such as phosphocreatine (PCr), inorganic phosphate (Pi) and phosphomonoesters (PM), are observed as spectral signals attenuated by the different $T_2$ decays and may not provide an accurate measure of the relative concentration of these metabolites. Additionally, reported scan times of up to four hours for 2D localized $^{31}P$ spectroscopy, using a spin-echo 3DFT method, are too long for reasonable human patient studies and, in fact, no actual patient studies utilizing these techniques appear to have been reported. It is therefore highly desirable to provide a method of, and apparatus for, obtaining a NMR spectroscopic metabolic image with full-body volume, multiple-voxel localization, especially to voxels of size from about 4 cm$^3$ to about 40 cm$^3$, of substantially undistorted FID spectral data. It is also highly desirable, since metabolite resonances are derived directly from freeinduction decays with minimal timing delays, that the integrated FID signals be so obtained as to more accurately represent the relative concentrations and absolute values of the metabolites present.

BRIEF SUMMARY OF THE INVENTION

In accordance with the present invention, a method for NMR spectroscopy metabolite imaging utilizes the steps of: applying to a desired portion of a sample a pulsed phase-encoding linear magnetic gradient signal in at least one of the three orthogonal dimensions of a Cartesian coordinate set, prior to acquisition of free-induction-decay NMR response signals from the sample portion; substantially eliminating from at least the sample portion eddy current fields induced responsive to the phase-encoding gradient pulses; maximizing the signal-to-noise ratio of the NMR response signals; and displaying the data resulting from Fourier transformation of the received response data.

In a presently preferred embodiment, a high-field NMR imaging system is provided with self-shielded gradient coils, to substantially remove eddy-current effects, and a maximized SNR quadrature-driven volume RF coil is utilized for both transmission of the excitation RF pulses and reception of the RF response signals. The acquired FID data is filtered and a Fourier transform reconstruction, of dimension d' equal to one greater than the number d of spatial dimensions to be displayed, is performed, prior to phase and baseline correction of the data for the image to be displayed.

Accordingly, it is an object of the present invention to provide a novel method of, and apparatus for, NMR spectroscopic metabolite imaging and quantification.

This and other objects of the present invention will become apparent upon a reading of the following detailed description, when considered in conjunction with the drawings.

DETAILED DESCRIPTION OF THE INVENTION

Figure 1A:
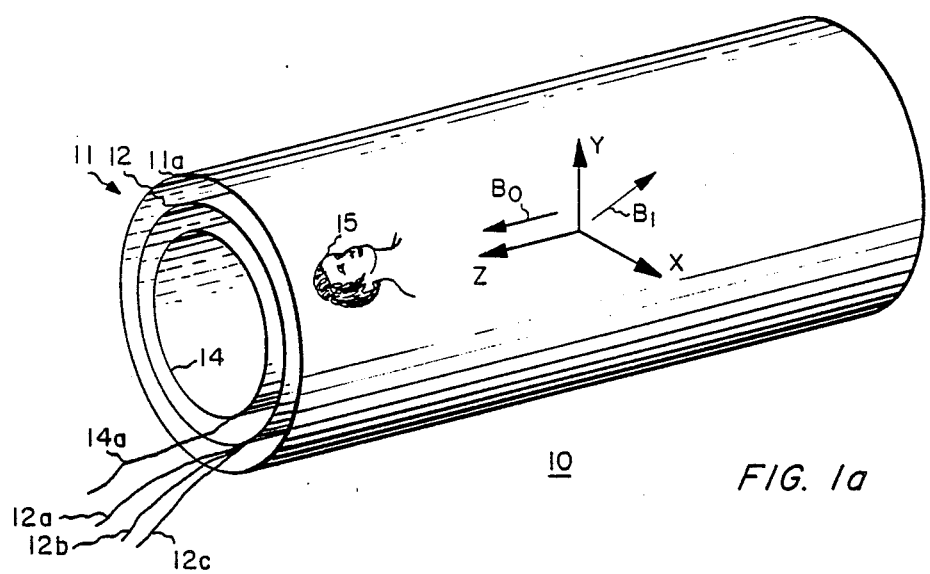
FIG. 1a is a perspective view of the bore of a NMR magnet and of the various coils and direction conventions utilized therewith.

Referring initially to FIG. 1a, a nuclear magnetic resonance (NMR) imaging system 10 utilizes a large magnet 11 having an open bore 11a therethrough, in which bore is provided a static magnetic field $B_0$, of magnitude on the order of about 1.5 Tesla. This static field is oriented along the longitudinal, or Z, axis of the cylindrical bore. While any volumetric coordinate system can be used, we have found it advantageous to use a Cartesian coordinate system, as illustrated. Within magnet bore 11a is positioned a set of gradient coils 12, having individual input cables 12a, 12b and 12c, so that gradient magnetic fields $G_X$, $G_Y$ and $G_Z$ can be individually provided in the static magnetic field $B_0$, in the respective X, Y and Z directions, responsive to respective X-gradient, Y-gradient and Z-gradient signals. A "whole-body" radio-frequency (RF) coil 14 is positioned within the bore of the gradient coil set 12, and is used at least for transmitting to an enclosed sample 15 an excitation RF magnetic field $B_1$, responsive to a RF signal in coil cable 14a. Responsive to immersion in the magnetic field and to excitation with a radio-frequency signal of proper characteristics, sample 15 re-radiates a RF response signal, which may be received by the RF coil 14, and the like, for subsequent processing.

Figure 1B:
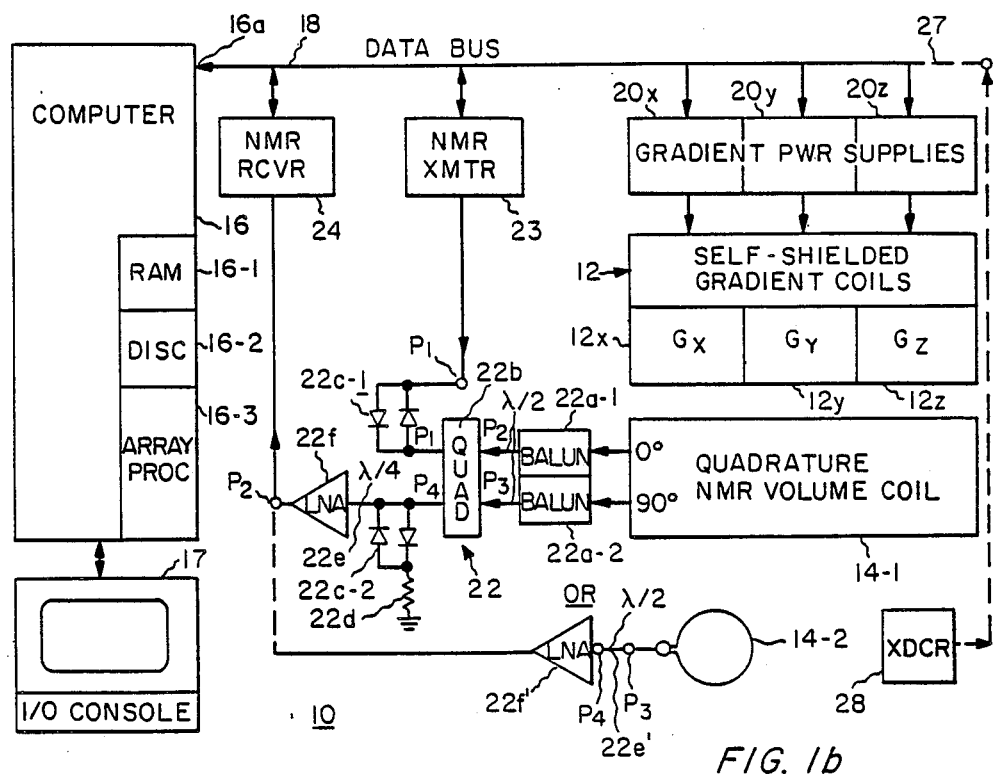
FIG. 1b is a schematic block diagram of a NMR imaging system in accordance with the principles of the present invention.

As best seen in FIG. 1b, in addition to the main magnet 11, the complete NMR imaging system 10 includes a computer means 16, having a suitable amount of random-access memory (RAM) means 16-1, disc memory means 16-2 and an array processor means 16-3; computer means 16 interfaces with an input/output console means 17. Computer 16 has a port 16a for interfacing to a data bus means 18 for sending and receiving data to, inter alia, gradient power supply means 20x, 20y and 20z, each providing the proper driving current to an associated one of the X, Y or Z gradient coils 12x, 12y or 12z. To substantially eliminate eddy-current problems, the gradient coils are of the self-shielded variety, as described and claimed in co-pending U.S. Pat. No. 4,737,716, issued Apr. 12, 1988, assigned to the assignee of the present application and incorporated herein in its entirety by reference. The volume RF coil may be a quadrature coil 14-1, operating with RF interface means 22 (including a pair of balun means 22ap-1 and 22a-2, with suitable half-wavelength cables and a quadrature hybrid means 22b, diode T/R means 22c-1 and 22c-2, characteristic-impedance load means 22d, quarter-wavelength cable 22e and a low-noise amplifier (LNA) means 22f) as known to the art for properly connecting a NMR transmitter means 23 and receiver means 24 to a common antenna means 14-1. Each of the transmitter means 23 and receiver means 24 also receives commands from bus means 18 and at least receiver means 24 also provides data back to computer means 16 via the data bus 18. The NMR response signal (emitted by the sample 15 to be studied) may, alternatively, be received with a surface coil means 14-2, having at least one surface coil each connected directly to its own LNA means 22f', and the like, for connection directly to receiver means 24. Advantageously, the signal-to-noise ratio (SNR) of the received signal is maximized by utilizing either a properly dimensioned surface coil or a maximized-SNR volume coil means 14-1 (such as one with a length less than 2 sample diameters long, as described and claimed in co-pending U.S. application Ser. No. 202,624, filed June 6, 1988) operated in true-quadrature mode, and used with an ultra-low-noise preamplifier, having a noise figure typically less than about 0.5 dB. (such as described and claimed in allowed co-pending U.S. application Ser. No. 172,828, filed Mar. 25, 1988); both of these applications are assigned to the assignee of the present invention and are incorporated herein in their entireties by reference. An array of a plurality of surface coils, with at least one LNA, can be used if the array has been designed to maximize SNR (such as the array described and claimed in allowed U.S. application Ser. No. 130,046, filed Dec. 7, 1987, assigned to the assignee of the present application and incorporated herein in its entirety by reference). Additional details concerning the NMR system 10 can be found in our U.S. Pat. No. 4,689,563, entitled "High-Field Nuclear Magnetic Resonance Imaging/Spectroscopy System", issued Aug. 25, 1987, and incorporated herein in its entirety by reference.

Figure 2A:
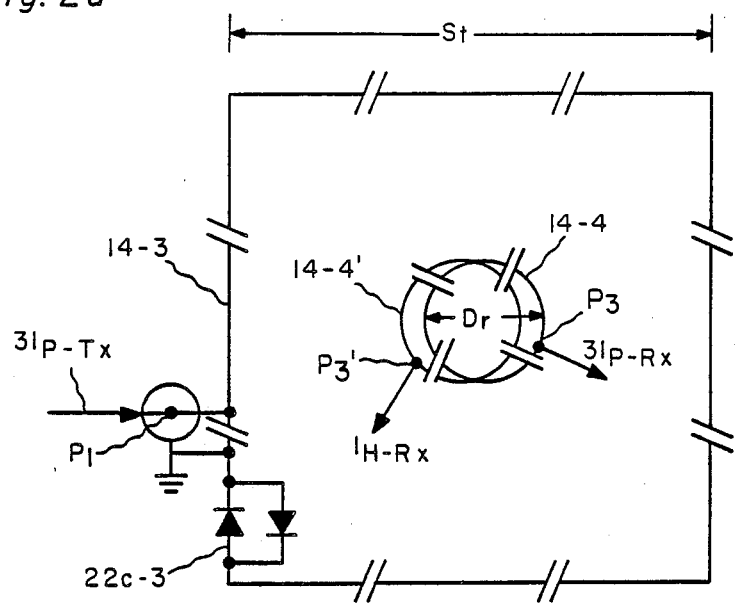
FIG. 2a is a schematic view of a nested set of coaxial surface coils used in one embodiment of the invention.
Figure 2B:
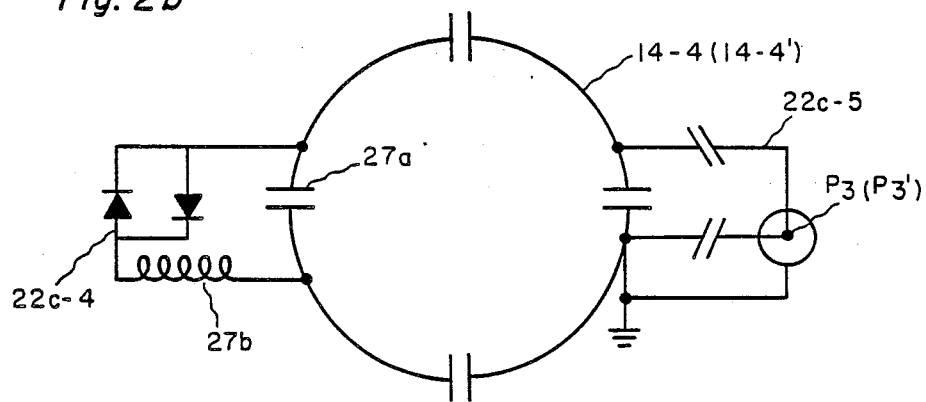
FIG. 2b is a schematic diagram of a surface detection coil used on one embodiment of the invention.
Figure 3A:
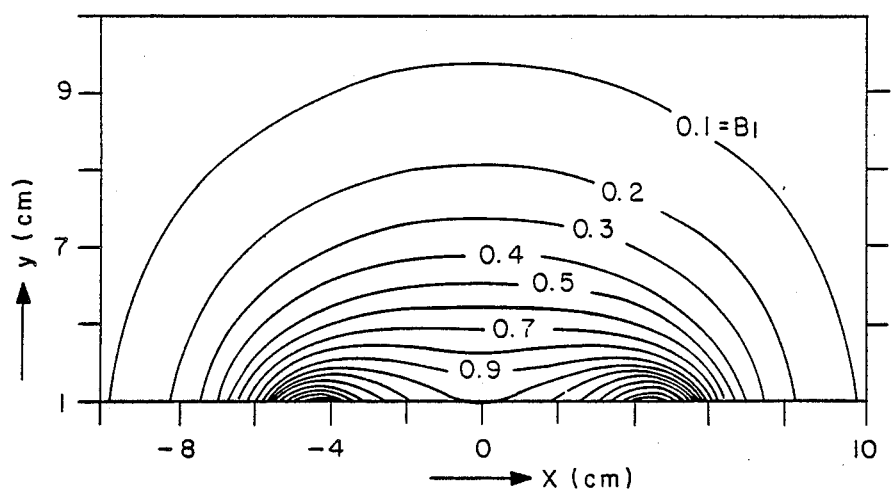
FIGS. 3a and 3b are a pair of graphs illustrating the spatial variation of the transverse RF field, $B_1$, and hence the NMR sensitivity, of one example of a surface detection coil.
Figure 3B:
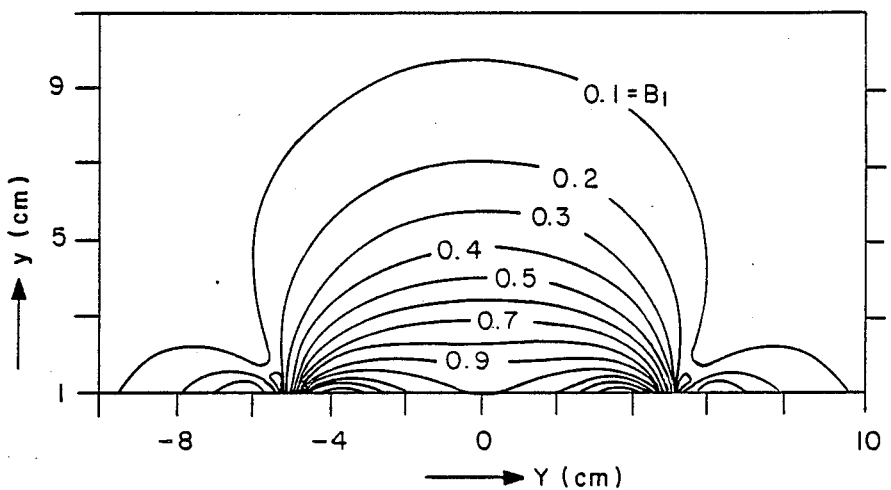

Referring now to FIG. 2a, yet another alternative RF coil arrangement employs coaxial coplanar surface coils. This arrangement is ideally suited for, but not restricted to, spectroscopy studies involving the human torso, such as of the heart, liver, and the like. In this mode of operation, the quadrature volume coil arrangement is disconnected at points $P_1$ and $P_2$ (FIG. 1b), LNA 22f is connected to point $P_2$, and coil 14-2 is disconnected from point $P_3$. Surface coil 14-3 is now connected to point $P_1$ and used at least for transmitting RF excitation field $B_1$ (for example in the Y direction) to sample 15. The dimensions of coil 14-3 (e.g. $S_t \approx 40$ cm.) are chosen such as to provide a substantially uniform RF field $B_1$ over the sensitive volume of a first receive coil 14-4, located adjacent to the region of the interest in the sample 15. The diameter $D_r$ of the receive coil is chosen to be comparable to the depth from the surface of the organ or tissue of most interest. For example, if surface coil 14-3 is of a square shape, with $S_t \approx 40$ cm, then coils 14-4 and 14-4' can each be one of a coaxial pair of circular coils, each with a diameter $D_r$ of about 10 cm, as would be suitable for heart studies; the field profiles of respective coil 14-4 or coil 14-4' are depicted for the X-Y plane and the Y-Z plane, respectively in FIG. 3a or FIG. 3b. Thus, it is evident from FIG. 3a that the sensitive volume of the coil over which $B_1 \geq 0.1$ of its maximum, falls in a region 26a and 26a' over which $B_1$ changes by not more than 25%. Transmit coil 14-3 may include diode blocking means 22c-3 which effectively turns the coil off during the response RF signal detection portion (e.g. time interval $T_s$, as will be shown in FIG. 4). As seen in FIG. 2b, either (or both) receive coils 14-4 can include tuned diode blocking means 22c-4, comprised of a tuned series resonant circuit (with inductance 27a and capacitance 27b) at the NMR frequency of the surface coil, in order to effectively turn the detection coil off during a transmission portion (e.g. time interval $T_t$ in FIG. 4) of an NMR spectroscopy study. The impedance of coils 14-3 and 14-4 in the presence of sample 15 can be adjusted to approximately the optimum output impedance of transmitter 23 and the input impedance $(Z_i)$ of LNA 22f using a capacitive divider means 22c-5. Additional coaxial coplanar coils 14-4' and the like may be added to detect NMR signals from other nuclei. For example, it may be desirable to provide a $^1$H NMR detection coil coil 14-4' of the same diameter as the $^{31}$P receive coil 14-4, so as to acquire $^1$H NMR images from the same sensitive volume in the sample from which spectra are acquired, in order to determine the anatomy from which the spectra derive. With coaxially-positioned coils there is no need to move the subject when switching from NMR imaging to NMR spectroscopy examinations; all that is required is to disconnect coil 14-4 from LNA 22f at point P$_4$ and in its place connect coil 14-4', via a λ/2 cable 22g, tuned to the new NMR frequency (e.g. the $^1$H frequency).

For spectroscopy studies and metabolite quantification in the heart, cardiac-gating transducer means 28 can provide a gate signal to data port 29, of the bus, to permit NMR spectroscopy (and imaging) pulse sequences to be applied synchronous to selected periods in the cardiac cycle.

Figure 4:
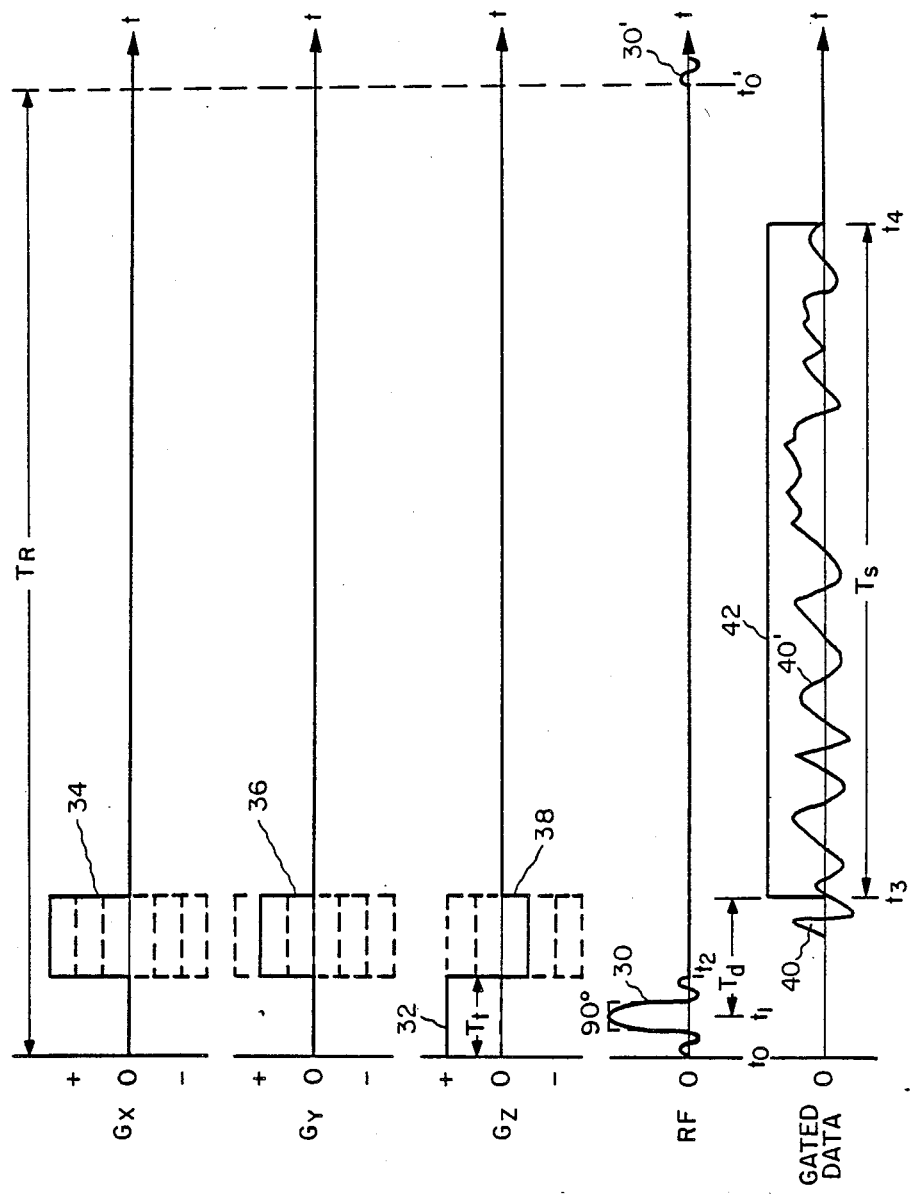
FIG. 4 is a set of time-related gradient magnetic field, radio frequency and gated data waveforms, employed one presently preferred embodiment of the method of the present invention.

In accordance with one aspect of the invention, spectroscopic metabolite images are obtained by operating system 10 in accordance with the gradient and RF signals shown in FIG. 4. Suitable signal sequences include those described and claimed in our U.S. Pat. No. 4,506,223, issued Mar. 19, 1985, and incorporated herein in its entirety by reference. For a three-dimensional (i.e. d=2 spatial dimensions) image, a spatially-selected NMR pulse uses a RF pulse signal 30, shown as being of a truncated sinc form, in conjunction with a non-zero G$_Z$ gradient lobe 32; both signals 30 and 32 occur in a time interval T$_t$, commencing at a time t$_0$, with the RF signal peaking at a mid-pulse time t$_1$, and both RF signal pulse and gradient lobe terminating substantially at a time t$_2$ thereafter. RF pulse 30 may be a 90° NMR pulse, or alternatively may be adjusted to maximize the detected NMR signal, in which case the pulse angle may be less than 90°, depending on the pulse sequence repetition period T$_R$. This initial pulse selects a slab with a small Z-axis width in the sample, so that spectroscopic information in the two dimensions of the selected plane (here, the X and Y dimensions) can be spatially encoded via the subsequent phase-encoding G$_X$ and G$_Y$ gradient lobes 34 and 36, respectively. By varying the G$_X$ and G$_Y$ gradient lobe 34 and 36 magnitudes, as shown by the broken line portions, different columns and rows of pixels in the X and Y directions are encoded. A Z-gradient G$_Z$ refocussing lobe 38 of substantially constant amplitude (the amplitude associated with the center of the Z slab) is provided while this two-dimensional spatial encoding sequence occurs. In the event that a three-dimensional volume (d=3) spatially-encoded image is desired, the amplitude of the G$_Z$ rephasing lobe 38 can be varied, as shown by the broken-line portions thereof, to also vary the responses in the Z direction. Similarly, if a single direction of spatial encoding is desired, say, the X direction only, then a zero value of Y-direction gradient lobe 36 and Z direction gradient lobe 38 would be utilized with the various sequential phase-encoding values of X-direction gradient lobe 34. The 1, 2 or 3-dimension spatial encoding gradient lobes occur from time t$_2$ to a spatial-encoding temporal endpoint time t$_3$ occurring at a fixed delay time interval T$_d$ after the spatially-selective pulse midpoint time t$_1$. The free-induction decay (FID) signal 40 begins substantially at the gradient lobe endpoint time t$_3$, at which time the received data is gated on, by a gating function 42 lasting for a time interval T$_s$, to be digitized starting at time t$_3$ and ceasing at a sequence ending time t$_4$. It is only the gated data 40', from time t$_3$ to time t$_4$, that is returned to the system computational means 16 for processing.

After the set of response RF signals is received and digitized, a (d')-DFT, where d'=(d+1) and d is the number of the spatial dimensions (1, 2 or 3), of the data set is performed. This Fourier transform is performed both with respect to the spatial gradient amplitudes and also with respect to time, to yield the spectroscopic image consisting of d spatial dimensions and one chemical-shift dimension, respectively. It will be seen that omission of a phase-encoding gradient in one or more of the spatial dimensions will result in a corresponding loss of spatial discrimination in those dimensions. If a single surface coil 14-2 (see FIG. 1b) is used, a particularly useful spectroscopic imaging sequence uses only one such phaseencoding gradient applied in the direction of the surface coil axis. Then, a 2DFT, with respect to gradient amplitude and time, yields spectra as a function of axial depth below the surface coil plane; localization in the other two spatial dimensions is provided by the inherent sensitivity profile of the surface coil, and the removal of gradient encoding in these other 2 dimensions reduces imaging time. A typical set of localized spectra can be acquired in about 10 minutes, with 20 cm$^3$ voxel resolution, dependent upon the depth of the voxel, utilizing a 6–10 cm diameter surface coil for $^{31}$P studies at about 25.86 MHz in a static magnetic field B$_O$=1.5T imaging system.

Figure 3C:
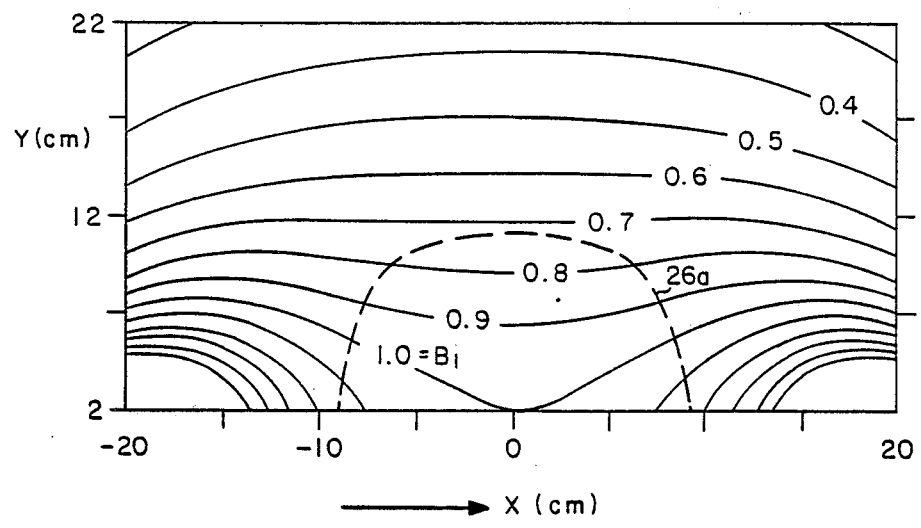
FIGS. 3c and 3d are a pair of graphs illustrating the spatial variation of the RF magnetic field $B_1$ produced by one example of a transmit surface coil.
Figure 3D:
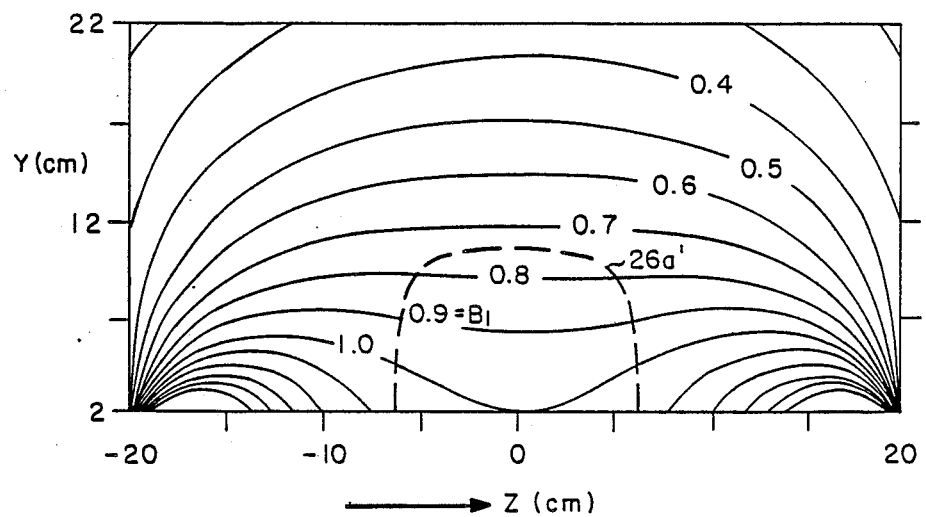
Figure 5A:
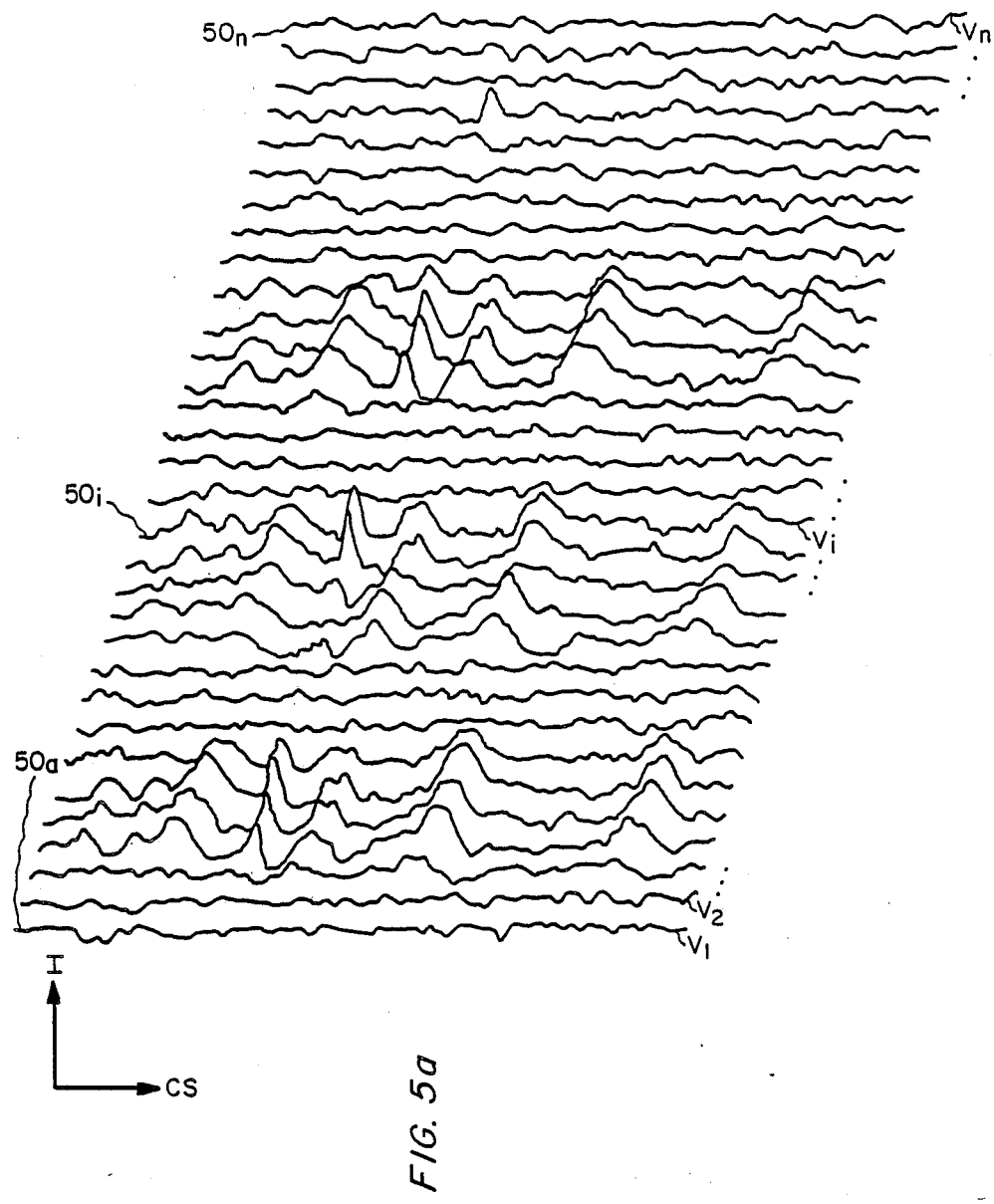
FIG. 5a is a perspective view of a multi-dimensional set of chemical shift image data (from the human head) after Fourier transformation.

Referring now to FIG. 5a, a set of intensity/chemical-shift-frequency spectra are shown, as the results of the (d+1)-DFT processing of the data from each of a plurality n of voxels, V$_i$, where 1≦i≦n. In the illustrated spectral set, each individual spectrum 50i is data obtained from one of the n (here, n=32) voxels of the sample. Thus, FIG. 5a can show, for example, a set of spectra for voxels with one combination of eight different X values and four different Y values in a XY plane, for a single Z thickness. As was seen, since spatial information can be encoded in 1, 2 or all 3 spatial dimensions with the use of 1, 2 or all 3 phase-encoded gradients, omission of any one phase-encoding gradient results in a corresponding loss of spatial discrimination in that dimension. However, the loss of spatial discrimination is compensated for by the reduced time necessary for acquisition of the data. A particularly useful three-spatial-dimensional (volume or d=3) spectroscopic imaging method uses the sequence of FIG. 4, with selective excitation of only that Z-axis slice then being imaged, when studying metabolites, such as the $^{31}$P metabolites, with relative long T$_1$ relaxation times (e.g. longer than 1 second). Because of the long relaxation time, a relatively long time interval T$_R$ must usually be used between sequence repetitions of the total of N$_x$·N$_y$ repetitions (where N$_x$ is the number of voxels in the X direction and N$_y$ is the number of voxels in the Y direction, for each of N$_Z$ different planes). Rather than waste the relaxation time interval, the sequence is repeated but with a different one of the N$_Z$ slices, or planes, being excited by a frequency offset selective-excitation pulse applied in the presence of gradient G$_z$ lobe 32 followed by rephasing lobe 38, at a repetition period of T$_R$/N$_z$. By filling the entire relaxation delay interval with interleaved excitations of different slices of the desired volume, the minimum time required for acquiring a volumetric spectroscopic image is reduced, compared to the other method. In addition, this method has two other advantages compared to the 4DFT (d=3) three-dimensional volume encoding method above: first, for small $N_z$ (e.g. $N_z \leq 8$) this method results in significantly less artefactual signals bleeding into selected slices from adjacent slices. Second, in situations where the RF excitation field $B_1$ is nonuniform, as for example occurs when using the maximal SNR volume coil described in copending U.S. application Ser. No. 202,624 (filed June 6, 1988), or when exciting the sample with a surface coil whose field is nonuniform across the region of interest in the sample, the RF pulse amplitude 30 may be adjusted to compensate for the nonuniformity on a slice-by-slice basis. In practice, the latter compensation is achieved by weighting the pulse amplitudes for each slice according to either the average $B_1$ field in the slice or the particular $B_1$ field in the slice at the level of an organ of interest (with field $B_1$ being deduced from the information in FIGS. 3a-3c herein, in FIG. 3 of application 202,624, or the like).

Figure 5B:
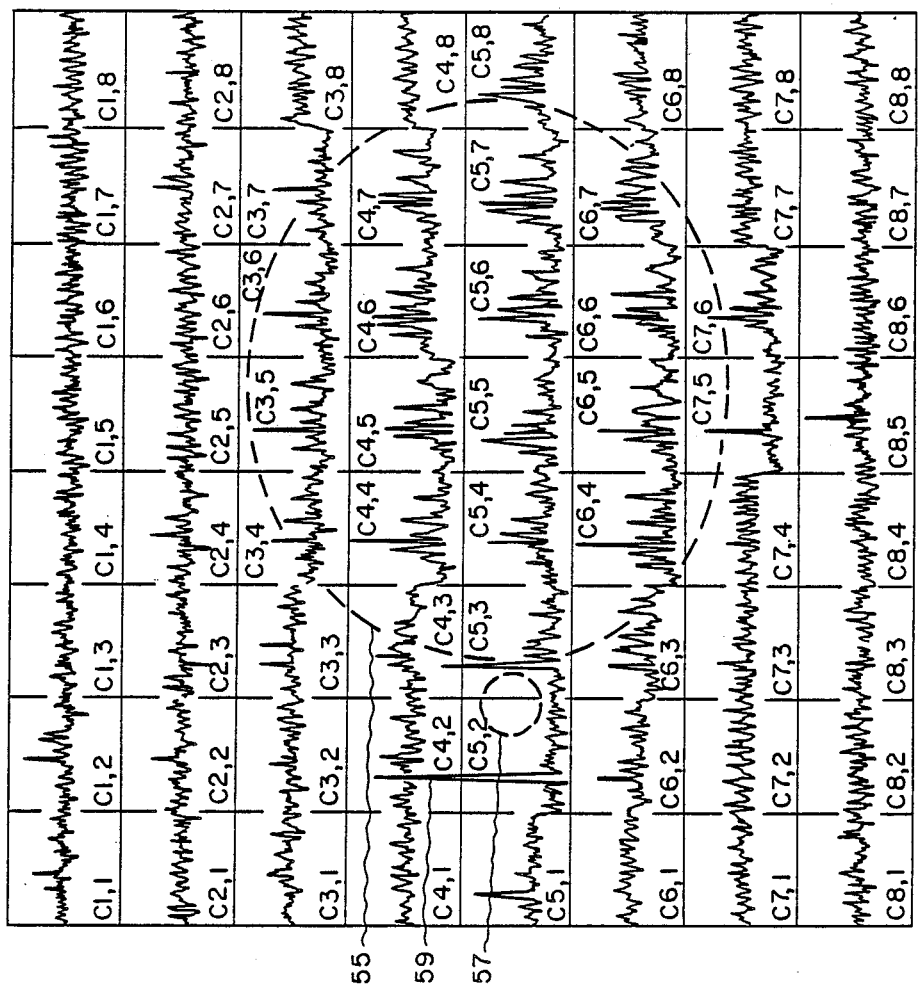
FIG. 5b is a set of chemical-shift spectra arranged in accordance with voxels of a sample (a human head) being imaged.

FIG. 5b shows a 3DFT set of spectra for a single-Z-thickness volume through the head with "cells" $C_{i,j}$ having one (i) of eight different X-axis voxel values and one (j) of eight different Y-axis voxel values. Thus, a total of 64 cells are defined (by eight different lobe 34 amplitudes and eight different lobe 36 amplitudes); a spectrum is provided for each cell. To aid in interpreting the array of spectra, a display may be superimposed of the periphery of the body portion being imaged. This outline 55 may be from an image taken prior to, during, or after the spectroscopic imaging procedure. A sample vial 57, having a known concentration of a known metabolite, can be placed in a known position (e.g. in front of the patient's head, as on a headband) so that a particular spectrum 57 is of a voxel (e.g. cell C5,2) containing only the known concentration sample (and air), and not any portion of the sample-to-be-imaged. Thus, a standard of known concentration, having a $T_2*$ relaxation time much greater than the phase-encoding gradient application delay time interval $T_d$, is located within the imaging field-of-view, but outside of the sample. The location of the metabolite of interest is denoted in three dimensions by a subscript ijk corresponding to its voxel coordinates (i,j,k); similarly, the location of the standard is denoted by a subscript lmn corresponding to its voxel coordinates (l,m,n). Metabolite concentrations can now be quantified by comparison of the intensity of spectral components. The concentration $A_{ijk}(p)$ of a particular metabolite R in a volume of sample $V_{ijk}$, compared to a small volume $V_s$ of known standard s of concentration $A_{lmn}(s)$ in the otherwise-empty-of-sample volume $V_{lmn}(\geq V_s)$, is $$A_{ijk}(p) = S_{ijk}(p) \cdot \exp(-T_d/T_2^*(s))/S_{lmn}(s) \cdot \exp(-T_d/T_2^*(p)) \cdot$$
$$(V_{ijk}/V_s) \cdot A_{lmn}(s) \cdot R_{ijk-lmn} \cdot (F(T_1(s), \alpha_{lmn})/F(T_1(p), \alpha_{ijk}))$$

where: $S_{ijk}(p)$ and $S_s$ are the integrated NMR signal intensities of the respective metabolite P in voxel (i,j,k) and standard s in voxel (l,m,n); $V_s$ is the volume of the standard in voxel (l,m,n); $R_{ijk-lmn}$ is the ratio of sensitivity of the imaging system (e.g. due to the NMR RF coil and other position-sensitive factors) at the sample voxel (i,j,k) to the standard-bearing voxel (l,m,n); $T^{2*}(p)$ and $T^{2*}(s)$ are the decay time constants of the transverse NMR magnetization of metabolite P in voxel (i,j,k) and standard s in voxel (l,m,n) in the absence of imaging gradients but including both intrinsic and instrumental contributions; and $F(T_1(s), \alpha_{lmn})$ and $F(T_1(p), \alpha_{ijk})$ are the $T_1$ saturation factors given by $$F(T_1,\alpha) = (1 - \exp(-T_4/T_1))\sin\alpha/(1 - \cos\alpha \cdot \exp(-T_R/T_1)),$$

corresponding to the standard s with a $T_1$ of $T_1(s)$ and NMR flip angle $\alpha_{lmn}$ in voxel (l,m,n), and metabolite P with a $T_1$ of $T_1(P)$ in voxel (i,j,k) experiencing a flip angle $\alpha_{ijk}$. The flip angle $\alpha_{abc}$ in any voxel (a,b,c) is easily calculated from the $B_1$ curves of the excitation coil, since $\alpha_{abc}$ is proportional to $B_{1abc}$ where $B_{1abc}$ is the $B_1$ at (a,b,c). If $T^{2*}(p)$ and $T^{2*}(s)$ are much greater than $T_d$, or if $T^{2*}(p) = T^{2*}(s)$, then $$A_{ijk}(p) = A_{lmn}(s) \cdot R_{ijk-lmn} \cdot (V_{ijk}/V_s) \cdot (S_{ijk}(p)/S_{lmn}(s))$$
$$\cdot F(T_1(s), \alpha_{lmn})/F(T_1(p), \alpha_{ijk})$$

We have successfully used $^{31}$P standards of several cm$^3$ vials of 1M solutions of phosphoric acid, of methylene diphosphonic acid or of phosphonitrilic chloride trimer (available from Aldrich Chemical Company: see J. K. Gard & J. J. H. Ackerman, Journal of Magnetic Resonance, vol. 51, pp. 124-127, (1983); images in an 8×8 3DFT array were obtained and quantified in about 30 minutes for 27 cm$^3$ and 64 cm$^3$ voxels in the brain, using the optimized SNR volume coil, and in 10-15 minutes for 20 cm$^3$ voxels in the heart using the coaxial surface coil set, and cardiac gating.

Figure 6:
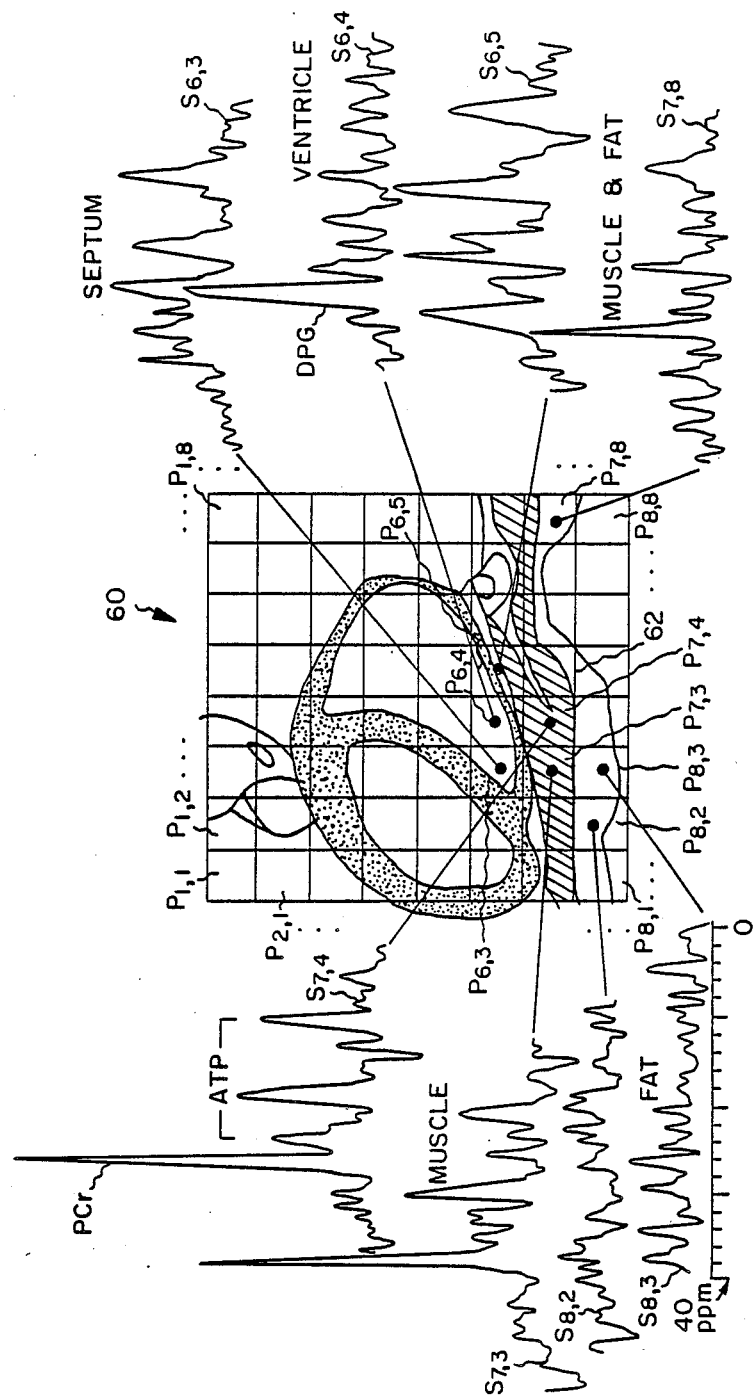
FIG. 6 is a schematic view of a portion of human anatomy (the heart) and of the various chemical shift spectra derived from various voxels within the anatomy, and useful in understanding the utility of the present invention.

FIG. 6 illustrates one possible form for the display and presentation of the spectroscopic imaging information acquired by use of the present invention. Here, a slice-selective, 8×8 voxel, 256 point 3DFT imaging sequence has been used, with $T_d$ of about 2.7 mSec. (with about 2.2 mSec. used for the slice-selective gradient refocussing lobe and the phase-encoding gradient lobes, including rise and fall times), and a 10 cm. diameter surface detection coil. The NMR pulse power was adjusted to maximize the SNR in $^{31}$P spectra derived from the entire selected image slice in the absence of phase-encoding gradients immediately prior to commencement of the spectroscopic imaging procedure. Following data acquisition and three-dimensional FT reconstruction, absorption mode spectra were inverse-transformed, exponentially-multiplied (12 Hz line-broadening), zero-filled, retransformed, phasecorrected (zero and first order), and baseline-flattened. The location of a pixel $P_{r,c}$ having the anatomy of interest, relative to each spectroscopic image, was determined by a conventional (e.g. gradient-recalled acquisition in the steady state (GRASS)) technique of $^1$H NMR imaging using a whole body $^1$H NMR coil emplaced about the $^{31}$P NMR coil, and without moving the subject at all; a $^{31}$P coil, at 25.9 MHz in a 1.5T magnet, was found to be fairly transparent to the 63.9 MHz $^1$H signals. The $^1$H NMR signal from the selected spectroscopic image slice was also used to shim the magnet homogeneity prior to the $^{31}$P procedure, which used the depth-resolved surface coil spectroscopy (DRESS) response signal acquisition procedure, as described and claimed in U.S. Pat. No. 4,629,988, issued Dec. 16, 1986 and incorporated herein in its entirety by reference. The $^1$H image 60 is divided into a matrix of pixels $P_{r,c}$ where r is the row number ($1 \leq r \leq 8$) and c is the column number ($1 \leq c \leq 8$). While spectra are available (as seen in FIG. 5) for all 64 voxels in the spectroscopic image, we chose to display only 8 here, so that they could be enlarged to show detail. The spectra $S_{7,3}$ and $S_{7,4}$ of predominantly muscle-containing pixels $P_{7,3}$ and $P_{7,4}$ clearly show large amounts of both PCr and ATP, which are not present in the spectra $S_{8,2}$ and $S_{8,3}$ of predominantly fat-containing pixels $P_{8,2}$ and $P_{8,3}$. Note that the line 62 dividing pixel rows 7 and 8 has been so positioned as to cause these two pairs of pixels to have completely different forms of material therein. Pixels, such as $P_{6,5}$ or $P_{7,8}$, having a combination of muscle and fat, have spectra (e.g. $S_{6,5}$ or $S_{7,8}$) in which the concentrations of PCr and ATP are "smeared". Note the markedly reduced PCr presence in the spectrum $S_{6,3}$ of septum pixel $P_{6,3}$ and the high concentration of DPG in the spectrum $S_{6,4}$ of ventricle pixel $P_{6,4}$.

While several presently preferred embodiments of our novel methods of, and apparatus for, NMR spectroscopic metabolite imaging and quantification have been described in detail herein, many modifications and variations will now be apparent to those skilled in the art. For example, additional details can be had by reference to an article, "Human in Vivo Phosphate Metabolite Imaging with $^{31}$P NMR", in Magnetic Reson in Medicine 7, pp 319-336 (1988), which is incorporated herein in its entirety by reference. It is our intent, therefore, to be limited only by the scope of the appending claims and not by the particular details and instrumentalities provided by way of explanation herein.

What we claim is:

1. A method for nuclear magnetic resonance (NMR) cmspectroscopic imaging of metabolites in a sample, comprising the steps of:
   (a) placing the sample in a static magnetic field $B_0$ directed in a first direction of a coordinate set;
   (b) exciting NMR signals in at least a desired portion of the sample;
   (c) applying to at least a desired portion of the sample a combination of d, where d=1, 2 or 3, phase-encoding magnetic field gradients, each in a different direction in the coordinate set, to define a d-dimensional set of voxels within the sample portion, in a manner to substantially eliminate from at least the desired sample portion eddy currents induced response to any phase-encoding gradient;
   (d) then acquiring a free-induction-decay (FID) NMR response signal from each of the different voxels of the set within the sample portion; and
   (e) processing the SNR-maximized FID response signals set to obtain a displayable image of the spectral information contained in at least one of the FID response signals.

2. The method of claim 1, wherein step (e) includes the step of performing a d'-dimension Fourier transform, where d'=d+1, upon the response signals set.

3. The method of claim 1, further comprising the step (f) of maximizing the signal-to-noise ratio (SNR) of the set of acquired FID response signals.

4. The method of claim 3, wherein step (f) includes the steps of: receiving each FID response signal with an antenna which is a selected one of a volume RF coil having a maximized SNR and an array of at least one surface coil; and amplifying the RF signal from each antenna with a preamplifier having a noise figure less than about 1 dB.

5. The method of claim 4, wherein a single surface coil antenna is used; and a d=1 gradient is provided along the surface coil axis.

6. The method of claim 4, wherein a d=2 plane of the sample is to be imaged; and further comprising the step of limiting the portion of the sample from which a FID response is evoked by selectively exciting a slab with a preselected width in a dimension substantially perpendicular to the imaged plane.

7. The method of claim 6, wherein the receiving antenna is a volume RF coil.

8. The method of claim 7, wherein the volume RF coil has a length less than twice the maximum radius of the sample.

9. The method of claim 1, wherein d=3 and wherein step (b) includes the step of selectively exciting NMR signals in a thick slab of the sample oriented orthogonal to one of the phase-enclosing gradient directions.

10. The method of claim 1, further including the steps of: providing, within the field-of-view of the image and external to the sample, a standard of a metabolite with a known concentration; and deriving from the NMR response signals displayable information about the concentration, with respect to the known standard, of at least one desired metabolite.

11. The method of claim 10, wherein the deriving step includes the step of quantifying the concentration $A_{ijk}(p)$ of each p-th desired metabolite in a voxel (ijk) as $A_{ijk}(p\quad)\cdot(V_{ijk}/V_s)\cdot(S_{ijk}(p)\cdot\exp(-T_d/T^{2*}(s)/(S_{lmn}(s)\cdot\exp(-T_d/T_2^*(p))\cdot F(T_1(s),\quad \alpha_{lmn})/F(T_1(p),\quad \alpha_{ijk})\cdot R_{ijk-lmn}$, where: $A_{lmn}(s)$ is the concentration of the standard; $V_s$ or $V_{ijk}$ is the volume of respective standard or sample in an associated respective voxel volume; $S_{ijk}(p)$ or $S_{lmn}(s)$ is the integrated NMR signal intensity of the respective p-th metabolite in volume $V_{ijk}$ or the standard in the volume $V_{lmn}$; $T_d$ is the gradient delay time interval; $T_2$ is the spin-spin relaxation time constant of the desired p-th metabolite; and $R_{ijk-lmn}$ is the ratio of sensitivity of the imaging system at the sample volume to the standard-bearing volume.

12. A method for nuclear magnetic resonance (NMR) spectroscopic imaging of metabolites in a sample, comprising the steps of:
   (a) placing the sample in a static magnetic field $B_O$ directed in a first direction of a coordinate set;
   (b) selectively exciting at least one of a plurality N of slices in at least a desired portion of the sample; in a direction parallel to a second direction of the coordinate set;
   (c) applying to at least the desired portion of the sample a combination of d, where d=1, or 2, phaseencoding magnetic field gradients, each in a different direction from said second direction in the coordinate set, to define a (d+1)-dimensional set of voxels within the sample portion, in a manner to substantially eliminate from at least the desired sample portion eddy currents induced response to any phase-encoding gradient;
   (d) then acquiring a free-induction-decay (FID) NMR response signal from each of the different voxels of the set within the sample portion; and
   (e) repeating steps (b)-(d) to excite successive different ones of the plurality of N slices; and
   (f) processing the SNR-maximized FID response signal sets evoked from each slice to obtain for each slice a displayable image of the spectral information contained in at least one of the FID response signals.

13. The method of claim 12, wherein the repetition time in step (e) is less than the spin-lattice relaxation time of at least one of the metabolites in the sample.

14. The method of claim 12, wherein the selective excitation step (b) is optimized to compensate for nonuniformity in the RF excitation field across the at least one slice.

15. The method of claim 12, further including the step of acquiring a 1H NMR image of at least the desired portion of the sample to determine the anatomy of the sample corresponding to the spectroscopic information.

16. Apparatus for nuclear magnetic resonance (NMR) spectroscopic imaging of metabolites in a sample, comprising:
means for providing through the sample a static magnetic field $B_0$ in a first direction of a coordinate set;
means for providing radio-frequency (RF) field to excite NMR response signals from at least a desired portion of the sample;
means for applying to at least a desired portion of the sample a combination of d, where d=1, 2 or 3, phaseencoding magnetic field gradients, each in a different direction in the coordinate set, to define a d-dimensional set of voxels within the sample portion, in a manner to substantially eliminate from at least the desired sample portion eddy currents induced responsive to any phaseencoding gradient;
means for acquiring a free-induction-decay (FID) NMR response signal from each of the different voxels of the set within the sample portion; and
means for processing the SNR-maximized FID response signals set to obtain a displayable image of the spectral information contained in at least one of the FID response signals.

17. The apparatus of claim 16, wherein the processing means includes means for performing a d'-dimension Fourier transform of the response signals set, where d'=(d+1).

18. The apparatus of claim 16, further comprising means for maximizing the signal-to-noise ratio (SNR) of the acquired FID response signal set.

19. The apparatus of claim 18, wherein said maximizing means includes: antenna means for receiving each FID response signal; and means for amplifying the RF signal from each antenna, with a noise figure less than about 1.0 dB.

20. The apparatus of claim 19, wherein said antenna means is a selected one of a volume RF coil having a maximized SNR, a set of coaxial surface coils and an array of at least one surface coil.

21. The apparatus of claim 20, wherein d=1, and said antenna means is a single surface coil.

22. The apparatus of claim 20, wherein said antenna means is a volume RF coil having a length less than twice the maximum radius of the sample.

23. The apparatus of claim 19, wherein the antenna means includes at least one surface coil, each with a diameter adjusted to approximately equal the distance of the portion of interest in the sample from the sample surface.

24. The apparatus of claim 19, wherein the antenna means includes a coaxial surface coil set having at least one transmitter coil.

25. The apparatus of claim 24, wherein the coaxial surface coil set also includes a receiver coil, and the size of the transmitter coil is selected to produce a substantially uniform RF field $B_1$ across a sensitive volume of the receiver coil.

26. The apparatus of claim 16, further including means, within the field-of-view of the image and external to the sample, for providing a standard of a metabolite with a known concentration; and said processing means includes means for deriving from the NMR response signals displayable information about the concentration, with respect to the known standard, of at least one desired metabolite.

27. The apparatus of claim 26, wherein the deriving means operates to quantify the concentration $A_{ijk}(p)$ of each p-th desired metabolite in a voxel (ijk) as $$A_{ijk}(p)=A_{lmn}(s)\cdot(V_{ijk}/V_s)\cdot(S_{ijk}(p))\cdot\exp(-T_d/T_2^*(s))/(S_{lmn}(s)\cdot\exp(-T_d/T_2^*(p)))\cdot F(T_1(s), \alpha_{lmn})/F(T_1(p), \alpha_{ijk})\cdot R_{ijk-lmn},$$

where: $A_{lmn}(s)$ is the concentration of the standard; $V_s$ or $V_{ijk}$ is the volume of respective standard or sample in an associated respective voxel volume; $S_{ijk}(p)$ or $S_{lmn}(s)$ is the integrated NMR signal intensity of the respective p-th metabolite in volume $V_{ijk}$ or the standard in volume $V_{lmn}$; $T_d$ is the gradient delay time interval; $T_2$ is the spin-spin relaxation time constant of the desired metabolite; and $R_{ijk-lmn}$ is the ratio of sensitivity of the imaging system at the sample volume to the standard-bearing volume.

28. The apparatus of claim 16, further comprising means for synchronizing the commencement of RF excitations with desired points in the cardiac cycle.

29. The apparatus of claim 16, further including: means for acquiring a 1H NMR image; and means for displaying at least one spectrum for each selected part of the 1H image.

30. The apparatus of claim 16, further comprising means for adjusting the amplitude of the RF excitation signal to compensate for RF field nonuniformities.

* * * * *